US008130334B2

(12) United States Patent
Okabe

(10) Patent No.: US 8,130,334 B2
(45) Date of Patent: Mar. 6, 2012

(54) ACTIVE MATRIX SUBSTRATE, APPARATUS FOR MANUFACTURING THE SAME AND DISPLAY DEVICE USING THE SAME

(75) Inventor: Tohru Okabe, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 1533 days.

(21) Appl. No.: 11/065,975

(22) Filed: Feb. 25, 2005

(65) Prior Publication Data

US 2005/0206796 A1    Sep. 22, 2005

(30) Foreign Application Priority Data

Mar. 18, 2004 (JP) ................... 2004-077661
Jan. 7, 2005 (JP) ................... 2005-002370

(51) Int. Cl.
*G02F 1/136* (2006.01)
(52) U.S. Cl. ............... 349/43; 349/158; 349/187
(58) Field of Classification Search ........ 349/43–45, 349/158, 40, 59, 187, 149–152
See application file for complete search history.

(56) References Cited

U.S. PATENT DOCUMENTS

| | | | | | |
|---|---|---|---|---|---|
| 4,971,829 | A | * | 11/1990 | Komura et al. | ............... 427/447 |
| 5,508,532 | A | * | 4/1996 | Teramoto | ........................ 257/59 |
| 5,796,121 | A | | 8/1998 | Gates | |
| 6,618,112 | B1 | * | 9/2003 | Yoshimura et al. | ........... 349/155 |
| 6,692,997 | B2 | | 2/2004 | So et al. | |
| RE39,798 | E | * | 8/2007 | Ono et al. | ....................... 349/43 |
| 2001/0017372 | A1 | | 8/2001 | Koyama | |
| 2001/0052949 | A1 | * | 12/2001 | Yamaguchi et al. | ............ 349/39 |
| 2003/0223249 | A1 | * | 12/2003 | Lee et al. | ....................... 362/561 |
| 2004/0257520 | A1 | * | 12/2004 | Yoshimura et al. | ........... 349/187 |
| 2006/0238690 | A1 | * | 10/2006 | Angelopoulos et al. | ....... 349/143 |

FOREIGN PATENT DOCUMENTS

| | | |
|---|---|---|
| JP | 4-273166 | 9/1992 |
| JP | 06-010929 U | 2/1994 |
| JP | 08-86993 | 4/1996 |
| JP | 2003-280553 A | 10/2003 |

* cited by examiner

*Primary Examiner* — Thanh-Nhan P. Nguyen
(74) *Attorney, Agent, or Firm* — Keating & Bennett, LLP

(57) ABSTRACT

An active matrix substrate comprises a substrate made of a plastic material and a plurality of TFTs which are arranged in matrix configuration on one side of the substrate and connected to signal wires. Inorganic insulating films are formed on both sides of the substrate. A conductive film is formed on the other side of the substrate on which the TFTs are not formed and the conductive film is electrically grounded. This configuration prevents dielectric breakdown caused in the TFTs by static charge, avoids defects derived from long-term static buildup and suppresses expansion, contraction and warpage of the plastic substrate.

2 Claims, 3 Drawing Sheets

ACTIVE MATRIX SUBSTRATE, APPARATUS FOR MANUFACTURING THE SAME AND DISPLAY DEVICE USING THE SAME

CROSS-REFERENCE TO RELATED APPLICATIONS

This non-provisional application claims priority under 35 U.S.C. §119(a) on Japanese Patent Applications Nos. 2004-77661 filed on Mar. 18, 2004 and 2005-2370 filed on Jan. 7, 2005, the entire contents of which are hereby incorporated by reference.

BACKGROUND OF THE INVENTION (a) Field of the Invention

The present invention relates to an active matrix substrate including a substrate made of a plastic material, an apparatus for manufacturing the same and a display device using the same.

(b) Description of Related Art

Active matrix substrates including a plurality of thin film transistors (hereinafter abbreviated as TFT) formed on a glass substrate have been widely used for display devices such as liquid crystal displays, organic EL displays and electrophoretic displays.

In recent years, such various displays have been required to have portability and flexibility. Aiming at lightweight and flexibility, research and development have been carried out on active matrix substrates using a plastic substrate in place of the glass substrate.

The plastic substrate is preferably transferred on a so-called roll-to-roll system in the course of manufacture of the active matrix substrate. Application of the roll-to-roll system is significantly advantageous in that the substrate is transferred more quickly than a sheet-by-sheet system and a batch system which have commonly been employed for the transfer of the glass substrate. In addition, the plastic substrate is continuously unwound from the roll, thereby allowing the manufacture of the active matrix substrate with significantly improved efficiency.

Because of their extremely fine structure, the TFTs are susceptible to static charge generated in the course of manufacture or after assembly into a final product. That is, if the back surface of the active matrix substrate is electrostatically charged during the manufacture, the plastic substrate (or the glass substrate) plays a roll as a capacitor to induce charge on the TFTs formed on the front surface of the active matrix substrate. This brings about a problem of electrostatic breakdown in the TFTs.

To cope with the problem, there is a known technique of forming an ITO film as a conductive film on the back surface of the glass substrate having the TFTs on the front surface thereof (e.g., see Japanese Unexamined Patent Publication No. HEI4-273166). With this configuration, static charge generated on the back surface of the glass substrate is dispersed over the entire surface of the ITO film to prevent electrostatic breakdown in the TFTs. However, in most cases, the quantity of static charge generated on the glass substrate is not so large. Therefore, this configuration has not been employed in combination with the common transfer systems for the glass substrate.

As compared with the glass substrate, the plastic substrate is usually more prone to absorb moisture and has a higher thermal expansion coefficient. Accordingly, the plastic substrate is apt to cause expansion, contraction and warpage. Therefore, in order to form the TFTs with great precision in the manufacture of the active matrix substrate, it is necessary to suppress the expansion, contraction and warpage of the plastic substrate in some way during its transfer between processing apparatuses or within a processing apparatus. In recent years, the size of the substrate has been on the increase, and therefore the problem of the substrate expansion, contraction and warpage is becoming more noticeable.

Consequently, there has been used a transfer jig which is specially made for transferring the plastic substrate while suppressing the warpage thereof (e.g., see Japanese Unexamined Patent Publication No. HEI8-86993). The transfer jig includes a support substrate having relatively high rigidity so as not to become deformed easily and an adhesive layer formed on the support substrate. The transfer jig is so configured that a substrate which is relatively low in strength and rigidity, such as a plastic substrate, is fixed onto the support substrate via the adhesive layer. In this way, the transfer jig forcibly suppresses the warpage of the plastic substrate.

If the transfer jig is made of glass, however, the transfer jig would weigh more than three times as much as the plastic substrate itself. Therefore, in reality, it is difficult to use such a transfer jig directly in combination with a common manufacturing apparatus. The use of the transfer jig requires a modification to the manufacturing apparatus itself, thereby involving a cost increase due to the modification. Further, the use of the adhesive layer in the transfer jig has a problem in that unwanted gas is generated from the adhesive layer in a vacuum or peeling of the plastic substrate off the support substrate will be difficult if the adhesive layer is cured at high temperatures. Therefore, the transfer jig as described above has been used only in the atmospheric air at relatively low temperature.

As compared with the glass substrate, the plastic substrate is more prone to cause static buildup by friction and less likely to release the built-up static charge. Therefore, if the roll-to-roll system which offers significant advantages to the plastic substrate is employed, an extremely large quantity of static charge is generated upon winding and unwinding the substrate, resulting in a significant decrease in percentage of conforming products to the obtained display devices. Moreover, if a display device including the TFTs is operated for a long time in the dried condition, a trace quantity of charge is generated on the plastic substrate by air friction. The charge continuously applies unwanted bias to the display device, resulting in imprecise display on the display device. Thus, such a long-term static buildup has been a cause of defects.

SUMMARY OF THE INVENTION

The present invention has been achieved under the above-described circumstances. A principal object of the invention is to prevent dielectric breakdown caused in active elements by static charge, avoid defects derived from a long-term static buildup and suppress expansion, contraction and warpage of a plastic substrate as possible.

To achieve the above object, the present invention provides a conductive film and an inorganic film on a plastic substrate used for manufacturing an active matrix substrate.

Specifically, the active matrix substrate according to the present invention comprises: a substrate made of a plastic material; and a plurality of active elements which are arranged in matrix configuration on one side of the substrate and connected to signal wires, wherein a conductive film is formed on the other side of the substrate on which the active elements are not formed and an inorganic film is formed on one or both sides of the substrate.

The conductive film may have the function of preventing moisture permeation.

It is preferable that the conductive film is electrically grounded.

The substrate, inorganic film and conductive film may be made of a transparent material.

It is desirable that the conductive film is made of a conductive polymer material.

At least part of the conductive film may be covered with a protective film.

The protective film is desirably an inorganic film.

The present invention further provides an apparatus for manufacturing the active matrix substrate. The manufacturing apparatus comprises a substrate stage for supporting the substrate on a support surface. The support surface is made of a conductive material and electrically grounded.

It is preferable that the manufacturing apparatus includes a winding shaft for winding the substrate thereon in the form of a roll and the winding shaft is electrically grounded.

Further, the present invention provides an apparatus for manufacturing the active matrix substrate. The manufacturing apparatus comprises a substrate stage for supporting the substrate on a support surface and a grounding mechanism for electrically grounding the conductive film on the substrate while the substrate is placed on the support surface of the substrate stage.

It is preferable that the support surface of the substrate stage is made of an insulating material and the substrate stage includes an electrostatic chuck for holding the substrate.

The grounding mechanism may be arranged on the periphery of the substrate stage.

It is preferable that the manufacturing apparatus further comprises a winding shaft for winding the substrate thereon in the form of a roll and the winding shaft is electrically grounded.

Still further, the present invention provides a display device comprising the above-described active matrix substrate and a display medium layer which is driven by the active elements on the active matrix substrate, wherein the conductive film of the active matrix substrate is electrically grounded.

The effects of the present invention will be described below.

The active matrix substrate of the present invention is provided with an inorganic film which does not allow moisture to permeate into the substrate. Therefore, the substrate is prevented from expansion, contraction and warpage caused by moisture absorption into the substrate. This eliminates the need of a transfer jig which is exclusively used for correcting the warpage of the substrate. Further, in the manufacture of active elements which requires fine patterning, a mask pattern or the like is aligned with improved precision. Thus, the active matrix substrate is manufactured with great precision.

Because of the presence of the conductive film on the substrate, static charge, even if generated during the manufacture or in use of the active matrix substrate, is uniformly dispersed over the entire surface of the conductive film. Therefore, even if the active matrix substrate is manufactured from a plastic substrate which is likely to generate static charge, dielectric breakdown in the active elements is prevented. As a result, in the course of manufacture, the substrate is quickly transferred on the roll-to-roll system with efficiency while the dielectric breakdown caused in the active elements by static charge is prevented.

Since the conductive film is configured to prevent moisture absorption, the above-described inorganic film which does not allow moisture to permeate into the substrate is formed on the other side of the substrate to prevent the substrate from moisture absorption. That is, only a single inorganic film is required on one side of the substrate.

With the conductive film being electrically grounded, static charge generated on the substrate is quickly removed with reliability.

The substrate, inorganic film and conductive film are made of a transparent material. Therefore, the active matrix substrate becomes applicable to a transmissive display device which achieves transmissive display by making use of light passing through the substrate, inorganic film and conductive film.

Since the conductive film is made of a conductive polymer material, the conductive film is formed at the same time using the same manufacturing apparatus as the manufacture of the plastic substrate.

Since at least part of the conductive film made of the conductive polymer material is covered with a protective film such as an inorganic film, the conductive film becomes resistant to chemical agents which will be used in the manufacture of the active elements, such as an etchant.

The manufacturing apparatus of the present invention includes a grounding mechanism which allows electrical grounding of the conductive film while the substrate is placed on a support surface of a substrate stage. Therefore, the substrate is electrically grounded by mounting the substrate on the substrate stage. Thus, charge generated on the substrate is removed quickly and completely in a vacuum or plasma-generating environment where static charge is prone to occur.

The support surface of the substrate stage is made of an insulating material and the substrate stage includes an electrostatic chuck for holding the substrate. Therefore, the conductive film of the substrate is attracted to the electrostatic chuck by Johnsen-Rahbeck force. As a result, the substrate is held flat on the support surface of the substrate stage. Since the electrostatic chuck can be used with stability even in severe environments such as in a vacuum bath or at high temperatures, the warpage of the substrate is forcibly corrected throughout the process for manufacturing the thin film transistors. Thus, while maintaining its lightweight and slimness, the substrate which is held flat is transferred without using a bulky transfer jig.

The manufacturing apparatus includes winding shafts for winding the substrate thereon in the form of a roll and the winding shafts are electrically grounded. Therefore, an extremely large quantity of static charge which is generated on the plastic substrate upon winding and unwinding the substrate along the winding shafts is removed via the grounded winding shafts. Thus, the substrate is quickly transferred on the roll-to-roll system without any influence by static charge. The transfer on the roll-to-roll system allows suppressing the warpage of the substrate by tension between the rolls on both shafts.

Since the display device includes the above-described active matrix substrate and the conductive film of the active matrix substrate is electrically grounded, a trace quantity of static charge generated during the operation of the display device is removed. This prevents defects derived from a long-term static buildup, thereby improving the reliability of the device.

According to the present invention, the presence of the inorganic film which prevents moisture permeation suppresses expansion, contraction and warpage of the substrate caused by moisture permeation into the substrate. Therefore, the active matrix substrate is manufactured with great precision without using a bulky transfer jig specially made for correcting the warpage.

In addition to the above, the presence of the conductive film allows dispersion of an extremely large quantity of static charge generated on the substrate over the entire surface of the conductive film. This prevents dielectric breakdown in the active elements and avoids defects derived from a long-term static buildup to improve the reliability of the active matrix substrate. Further, the substrate is effectively transferred on the roll-to-roll system in the course of the manufacture, thereby allowing a reduction in manufacturing cost.

DETAILED DESCRIPTION OF THE INVENTION

Hereinafter, embodiments of the present invention will be described in detail with reference to the drawings, but the invention is not limited thereto. In the following embodiments, for example, the top and bottom on FIG. 1 are regarded as the "front" and "back" sides of a substrate, respectively.

EMBODIMENT 1

Figure 1:
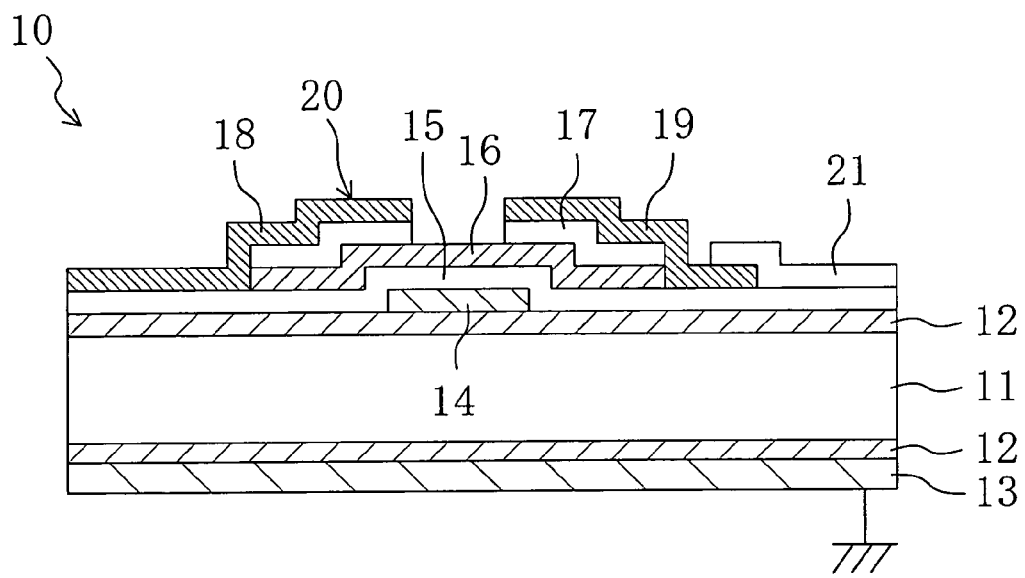
FIG. 1 is an enlarged sectional view illustrating an active matrix substrate according to Embodiment 1.
Figure 2:
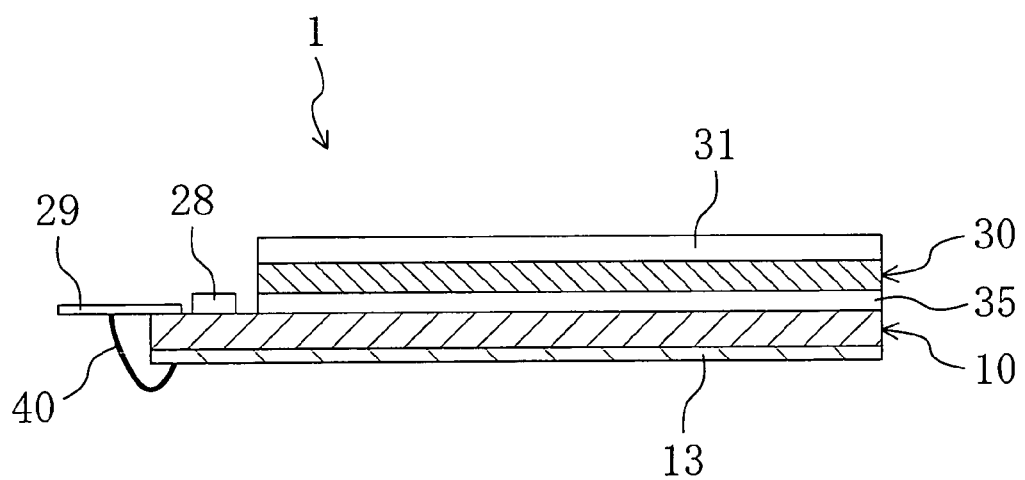
FIG. 2 is a sectional view schematically illustrating a liquid crystal display according to Embodiment 1.
Figure 3:
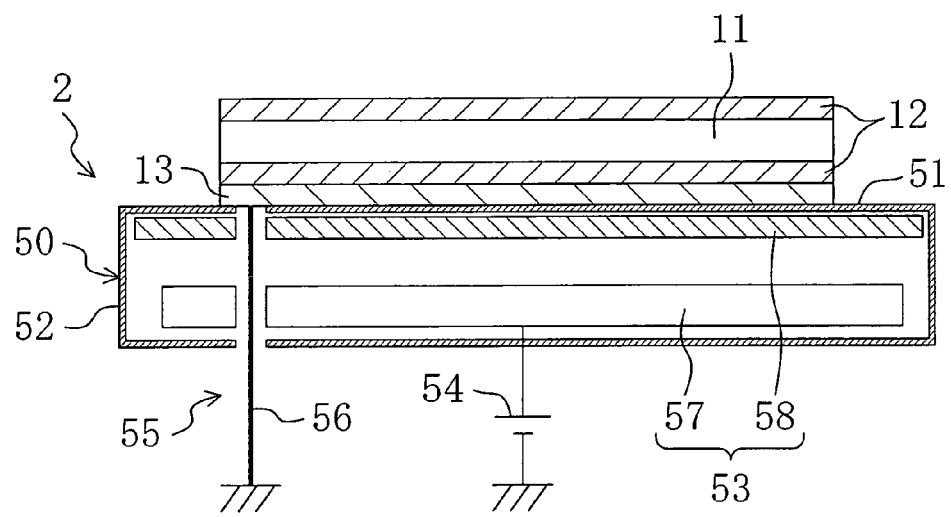
FIG. 3 is a sectional view illustrating a manufacturing apparatus according to Embodiment 1.
Figure 4:
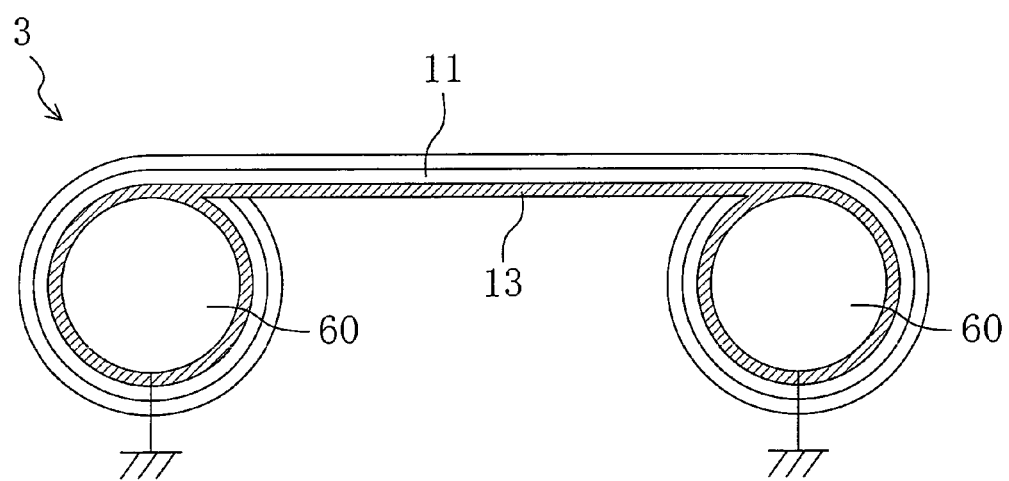
FIG. 4 is a sectional view illustrating a major part of a transfer device according to Embodiment 1.

FIGS. 1 to 4 illustrate embodiments of an active matrix substrate, an apparatus for manufacturing the same and a display device using the same. FIG. 1 is an enlarged sectional view of the active matrix substrate and FIG. 2 is a schematic sectional view of the display device. Further, FIGS. 3 and 4 are sectional views illustrating major parts of the manufacturing apparatus.

First, explanation is given of the active matrix substrate and the display device including the same. The display device according to the present embodiment is a transmissive liquid crystal display 1 which is commonly used for personal computers and television sets, for example. As shown in FIG. 2, the liquid crystal display 1 includes an active matrix substrate 10 and a counter substrate 30 arranged opposite the active matrix substrate 10 with a liquid crystal layer 35 as a display medium layer interposed therebetween.

The counter substrate 30 includes a color filter (not shown). A sheet polarizer 31 is formed on the outer side of the counter electrode 30.

The active matrix substrate 10 includes a substrate 11 and a plurality of active elements 20 arranged in matrix configuration on one side of the substrate 11. The active elements 20 are thin film transistors (hereinafter abbreviated as TFTs).

The substrate 11 is made of a transparent plastic material and shaped into a rectangular plate of 6 inches on a side and 0.2 mm in thickness, for example. The substrate 11 may be made of a resin only, or a composite of a resin such as an epoxy- or polyimide-based resin and another inorganic material.

On the front and back surfaces of the substrate 11, inorganic insulating films 12 are formed, respectively. The inorganic insulating films 12 are made of, for example, a transparent inorganic material such as silicon nitride or silicon oxide and formed by sputtering or CVD to have a thickness of 1000 Å. The inorganic insulating films 12 have the function of preventing moisture permeation. Further, the inorganic insulating films 12 allow improvement in adhesion of a conductive film 13 or a gate electrode 14 to be described later to the substrate 11 and in gas barrier property.

As shown in FIG. 1, TFTs 20 are formed at the front side of the substrate 11. That is, the TFTs 20 are formed on the inorganic insulating film 12 formed on the front surface of the substrate 11. The TFTs 20 are connected to a plurality of signal wires (not shown) and a plurality of scanning wires (not shown). Further, the TFTs 20 are connected with pixel electrodes 21 for driving the liquid crystal layer 35 on a pixel-by-pixel basis. The pixel electrodes 21 are made of ITO.

Each of the TFTs 20 includes a source electrode 18 which is connected to the signal wire for supplying a signal voltage through it, a drain electrode 19 for supplying a signal voltage to the pixel electrode 21 and a gate electrode 14 for switching power distribution from the source electrode 18 to the drain electrode 19.

The gate electrode 14 is made of Al, for example, and formed by sputtering followed by patterning on the surface of the inorganic insulating film 12 on the front side of the substrate 11. The gate electrode 14 is 1500 Å in thickness, for example. Further, at the front side of the substrate 11, a gate insulating film 15 is formed to cover the inorganic insulating film 12 and the gate electrode 14. The gate insulating film 15 is made of silicon nitride or the like and has a thickness of 3000 Å, for example.

On the front side of the gate insulating film 15, an amorphous silicon layer 16 and an $n^+$ amorphous silicon layer 17 doped with impurities of phosphorous (P) are formed in this order. The amorphous silicon layer 16 is formed on the front surface of the gate insulating film 15 and has a thickness of 1500 Å, for example. The $n^+$ amorphous silicon layer 17 is separated into two parts formed on the front surface of the amorphous silicon layer 16 and each of the separated parts is 500 Å in thickness, for example.

On the front surfaces of the separated $n^+$ amorphous silicon layers 17, the source electrode 18 and the drain electrode 19, which are made of Al, are formed to have a thickness of 1500 Å, respectively. Each of the layers 15, 16, 18 and 19 are patterned by plasma CVD, for example.

On the back side of the substrate 11, i.e., on the surface of the substrate 11 on which the TFTs 20 are not formed, a conductive film 13 made of a transparent conductive material such as ITO is formed in a thickness of 1000 Å, for example. That is, the conductive film 13 is laminated on the surface of the inorganic insulating film 12 formed on the back side of the substrate 11.

The conductive film 13 may be made of other materials than ITO such as IZO. If the active matrix substrate 10 is applied to a reflective liquid crystal display, the conductive film 13 may be an opaque conductive film made of Al, Ti, Mo or Cu. Alternatively, the conductive film 13 may be made of a conductive polymer material. By so doing, the conductive film 13 is easily formed by coating the conductive polymer at the same time as the manufacture of the substrate 11 using the same or simple manufacturing apparatus. This allows a reduction in manufacturing cost.

As shown in FIG. 2, an IC driver 28 is connected to an input terminal of the active matrix substrate 10 by an ACF adhesive or the like to input an electrical signal for image display on the liquid crystal display 1. Further, an FCP (flexible printed circuit) 29 is attached to the active matrix substrate 10 using an ACF adhesive to supply a control signal or a supply voltage to the IC driver 28 from an external circuit (not shown).

A ground wire 40 connects a ground terminal of the FCP 29 and the conductive film 13 on the active matrix substrate 10. That is, the conductive film 13 is electrically grounded. This configuration allows removal of charge generated on the substrate 11 via the conductive film 13.

Then, explanation is given of an apparatus 2 for manufacturing the above-described active matrix substrate. The manufacturing apparatus 2 includes a substrate stage (insulating substrate holder) 50 and a grounding mechanism 55.

The substrate stage 50 includes a box-shaped main body 52 having a support surface 51 on which the substrate 11 will be placed and an electrostatic chuck 53 installed in the main body 52 to hold the substrate 11. The main body 52 is made of an insulating material. That is, the support surface 51 of the main body 52 is also made of the insulating material. The electrostatic chuck 53 includes an internal electrode 57 which is connected to a power source 54 to generate static charge and a resistance heater 58 arranged opposite the internal electrode 57 (a single pole system).

The grounding mechanism 55 is arranged on the periphery of the substrate stage 50 and configured to electrically ground the conductive film 13 of the substrate 11 while the substrate 11 is placed on the support surface 51 of the substrate stage 50. In general, as shown in FIG. 3, the grounding mechanism 55 penetrates the substrate stage 50 in the vertical direction and includes a ground wire 56 whose lower end is connected to the ground plane. The upper end of the ground line 56 is biased upward by a spring which is not shown such that it protrudes out of the support surface 51 of the substrate stage 50 when the substrate 11 is not mounted on the substrate stage 50. When the substrate 11 is mounted on the substrate stage 50, the ground wire 56 is pressed downward. As a result, the substrate 11 comes into contact with both of the support surface 51 and the ground wire 56.

With the substrate 11 placed on the substrate stage 50, a certain voltage is applied to the internal electrode 57 of the electrostatic chuck 53 to generate positive and negative charges between the insulating surface of the main body 52 and the conductive film 13 of the active matrix substrate 10, thereby exerting Johnsen-Rahbeck force between them. As a result, the active matrix substrate 10 is fixed onto the substrate stage 50. That is, even if the substrate 11 is warped, the warped substrate 11 is made flat by mounting it on the substrate stage 50.

Instead of providing the grounding mechanism 55, the substrate 11 may preliminarily be discharged before manufacture into the active matrix substrate 10.

Next, explanation is given of a transfer device 3 for transferring the active matrix substrate in the course of manufacture. The transfer device 3 includes a pair of winding shafts 60 arranged parallel to each other as shown in FIG. 4. The winding shafts 60 are made of a conductive material such as metal and the substrate 11 is wound thereon in the form of a roll. Each of the winding shafts 60 is electrically grounded. In this configuration, the transfer device 3 transfers the substrate 11 from side to side on the roll-to-roll system by rotating the winding shafts 60 in the same direction in synchronization with each other.

Since the conductive film 13 formed on the substrate 11 is in contact with the surfaces of the winding shafts 60, the conductive film 13 is grounded via the winding shafts 60. Thus, the substrate 11 is transferred with the conductive film 13 being grounded, and then held on the substrate stage 50 of the manufacturing apparatus 2 to be subjected to the steps for manufacturing the TFTs 20 such as film formation, etching, coating and cleaning.

According to Embodiment 1, the inorganic insulating films 12 which prevent moisture permeation are formed on both sides of the substrate 11. Therefore, the substrate is prevented from expansion, contraction and warpage caused by moisture absorption into the substrate. As a result, the need of using a special transfer jig is eliminated. Further, in the manufacture of the TFTs 20 which requires fine patterning, a mask pattern is aligned with improved precision. Therefore, the active matrix substrate 10 is manufactured with high precision.

Further, because of the presence of the conductive film 13, static charge, even if generated during the manufacture or in use of the active matrix substrate 10, is uniformly dispersed over the entire surface of the conductive film 13. As a result, dielectric breakdown in the TFTs 20 is prevented, thereby improving the reliability of the active matrix substrate 10. Since the substrate is quickly transferred on the roll-to-roll system with efficiency in the course of manufacture, the manufacturing cost is significantly reduced.

In general, the roll-to-roll transfer system advantageously offers higher transfer speed than the sheet-by-sheet transfer system which is employed for transferring glass substrates one by one. However, upon quick winding or unwinding of the plastic substrate 11 on the winding the shafts, static charge is likely to occur by friction between the substrates 11.

Table 1 below shows a comparison between Example 1 which is the active matrix substrate 10 of the present embodiment and Comparative Examples 1 and 2 on maximum amount of static charge caused on the substrate surface during the transfer of the substrate. The active matrix substrate of Comparative Example 1 is transferred on the sheet-by-sheet transfer system and the active matrix substrates of Comparative Example 2 and Example 1 are transferred on the roll-to-roll system.

TABLE 1

|  | Comparative Example 1 | Comparative Example 2 | Example 1 |
| --- | --- | --- | --- |
| Substrate for the active matrix substrate | Glass | Plastic | Plastic |
| Maximum amount of static charge during transfer | 5 kV | 270 kV | 10 kV |

When the glass substrate of Comparative Example 1 is transferred by the common sheet-by-sheet transfer system, static charge of about 5 kV is generated by friction between the glass substrate and air or the transfer jig. However, static charge of such a level hardly affects the device.

When the plastic substrate of Comparative Example 2 is transferred by using a rolling transfer jig, friction between the substrates causes static charge of 270 kV on the substrate surface immediately after the unwinding. This is considerably high as compared with the static charge on the glass substrate of Comparative Example 1. Such high static charge brings about dielectric breakdown in devices formed on the plastic substrate, resulting in a decrease in percentage of conforming products to the manufactured display devices.

On the other hand, in the active matrix substrate 10 of the present embodiment, the static charge generated on the substrate by friction between the substrates is eliminated instantly via the conductive film 13 grounded to the winding shafts 60 as described in Embodiment 1. Therefore, the generation of static charge on the plastic substrate is prevented. As a result, the substrate is quickly transferred on the roll-toroll system while dielectric breakdown in active elements such as the TFTs 20 is prevented. This allows a reduction in manufacturing cost.

Table 2 below shows a comparison between Example 2 which is the active matrix substrate 10 of the present embodiment and Comparative Examples 3 and 4 on shift quantity of threshold voltage. The shift quantity of threshold voltage is measured by a long-term accelerated test performed under the common conditions for testing the device reliability, i.e., in a high temperature bath of 60° C. for 1000 hours. In Table 2, the shift quantity of threshold voltage of the active matrix substrate made of a glass substrate with TFTs formed thereon is regarded as 100%.

TABLE 2

|  | Comparative Example 3 | Comparative Example 4 | Example 2 |
|---|---|---|---|
| Substrate for the active matrix substrate | Glass | Plastic | Plastic |
| Shift quantity of threshold voltage | 100% | 248% | 103% |

In Comparative Example 3, as a result of long-term application of an operating voltage of about 10 V, or a voltage stress, to the amorphous silicon TFTs formed on the glass substrate, a minute defect occurs in the silicon nitride film 15 or the amorphous silicon layer 16. Therefore, the threshold voltage (at which a current starts flowing), which is an important value for determining the characteristics of the TFTs, is shifted by about 1 V. However, the shift of such a degree does not seriously affect the TFTs of common display devices.

In Comparative Example 4, the TFTs formed on the plastic substrate are likely to receive stress for a long time due to a bias caused by a trace quantity of charge generated during long-term operation. This is because of the tendency of the plastic substrate to cause a static buildup. Therefore, as a result of long-term operation in the presence of a trace quantity of charge, the shift quantity of threshold voltage becomes larger than that of the TFTs on the glass substrate of Comparative Example 3, as shown in Table 2. When the shift quantity is as large as described above, the switching characteristic of the TFTs is impaired, resulting in defects due to a long-term static buildup, such as a decrease in contrast. This brings about a serious problem in long-term operational reliability of the display device.

In the TFTs 20 of the present embodiment, a trace quantity of charge generated through the long-term operation is quickly removed outside from the active matrix substrate 10. As a result, the shift quantity of threshold voltage is significantly reduced as shown in the column of Example 2 in Table 2. Therefore, even if a plastic substrate is used in a display device, the resulting display quality is as reliable as that of the display device using the glass substrate.

Since the substrate 11, inorganic insulating films 12 and conductive film 13 are made of a transparent material, the active matrix substrate 10 is applicable to transmissive liquid crystal displays which achieve transmissive display by making use of light passing through the substrate 11, inorganic insulating film 12 and conductive film 13.

Since the manufacturing apparatus 2 is provided with the grounding mechanism 55, the substrate 11 is electrically grounded at the same time when the substrate 11 is mounted on the substrate stage 50. Therefore, charge generated on the substrate 11 is removed quickly and completely even if the active matrix substrate 10 is manufactured in vacuum or plasma-generating environment where static charge is prone to occur.

Further, since the conductive film 13 of the active matrix substrate 10 is connected to the grounding terminal of the FCP 29 via the ground wire 40, a trace quantity of static charge generated with the operation of the liquid crystal display 1 is removed. This allows improvement in reliability of the display.

Since the substrate stage 50 itself is provided with the electrostatic chuck 53 for holding the substrate 11, the conductive film 13 of the substrate 11 is attracted to the substrate stage 50 by Johnsen-Rahbeck force to hold the substrate 11. That is, the need of using a special transfer jig for correcting the warpage of the substrate 11 is eliminated. The electrostatic chuck can be used in severe environments such as in a vacuum bath or at high temperatures. Therefore, even if the substrate 11 is warped with an increase in ambient temperature, the warpage of the substrate 11 is corrected by making use of the Johnsen-Rahbeck force of the electrostatic chuck 53. This allows manufacture of the active matrix substrate 10 with great precision. The grounding mechanism 55 does not affect the manufacture of the active matrix substrate 10 because it is arranged on the periphery of the substrate stage 50.

Table 3 shows a comparison between Example 3 which is the active matrix substrate 10 of the present embodiment and Comparative Examples 5 and 6 on the amount of substrate warpage which occurs with an increase in ambient temperature up to 150° C. The active matrix substrates of Example 3 and Comparative Examples 5 and 6 are provided with a SiNx film of 2000 Å in thickness formed at room temperature, respectively. The active matrix substrate 10 of Example 3 is supported on the substrate stage 50 of the manufacturing apparatus 2. In Table 3, the amount of substrate warpage is a height difference between the highest part and the lowest part of the substrate placed on a horizontal plane.

TABLE 3

|  | Comparative Example 5 | Comparative Example 6 | Example 3 |
|---|---|---|---|
| Substrate for the active matrix substrate | Conductive material | Plastic | Plastic |
| Amount of substrate warpage | 0 mm | 20 mm | 0 mm |

In the active matrix substrate of Comparative Example 6 manufactured from a common plastic substrate having no conductive film thereon, there is a great difference in thermal expansion coefficient between the plastic substrate and the SiNx film. Therefore, regardless of the substrate size of about 6 inches in diagonal line, the amount of substrate warpage reaches 20 mm. The warpage becomes more significant with further increase in ambient temperature or substrate size. Even with the warpage of 20 mm, films to be formed thereon by a coating apparatus will cause difference in quality and thickness. As a result, the resulting display device will cause significant irregularity in display.

On the other hand, in the active matrix substrate 10 of Example 3, the presence of the conductive film 13 allows the substrate 11 to be held by the electrostatic chuck 53 of the manufacturing apparatus 2, thereby suppressing the warpage of the substrate 11. Also in the active matrix substrate of Comparative Example 5 manufactured from a conductive substrate, the conductive substrate is held by the electrostatic chuck 53 of the manufacturing apparatus 2 in the same manner as Example 3. Therefore, the warpage of the substrate is hardly observed.

Thus, the active matrix substrate 10 of Example 3 keeps the substrate surface as flat as that of Comparative Example 3 by merely using the electrostatic chuck.

EMBODIMENT 2

Figure 5:
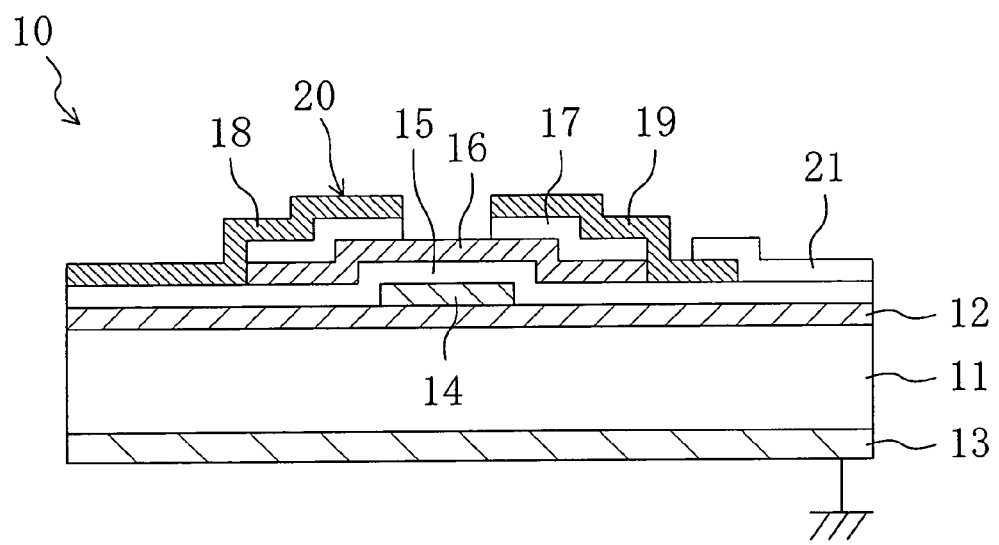
FIG. 5 is an enlarged sectional view illustrating an active matrix substrate according to Embodiment 2.

FIG. 5 illustrates an active matrix substrate 10 according to Embodiment 2 of the present invention. In the present embodiment, the same constituents as those shown in FIGS. 1 to 4 are given with the same reference numerals and detailed explanation thereof is omitted.

Unlike Embodiment 1 in which the inorganic insulating films 12 are formed on both sides of the substrate 11, an active matrix substrate of Embodiment 2 includes only a single inorganic insulating film 12 formed on one side of the substrate 11 as shown in FIG. 5.

More specifically, the inorganic insulating film 12 is formed on the front surface of the substrate 11 in the same manner as Embodiment 1. On the other hand, the conductive film 13 is formed directly on the back surface of the substrate 11. The conductive film 13 has the function of preventing moisture permeation.

According to this configuration, the front and back sides of the substrate 11 are rendered waterproof by the inorganic insulting film 12 and the conductive film 13, respectively. In this way, the substrate 11 is prevented from expansion, contraction and warpage.

According to Embodiment 2, the conductive film 13 is configured to prevent moisture permeation. This eliminates the need of forming the inorganic insulating films 12 on both sides of the substrate 11. With a single inorganic insulating film 12 formed on one side of the substrate 11, moisture permeation into the substrate 11 is suitably prevented. In other words, only a single inorganic insulating film 12 is required on a single side of the substrate 11.

EMBODIMENT 3

Figure 6:
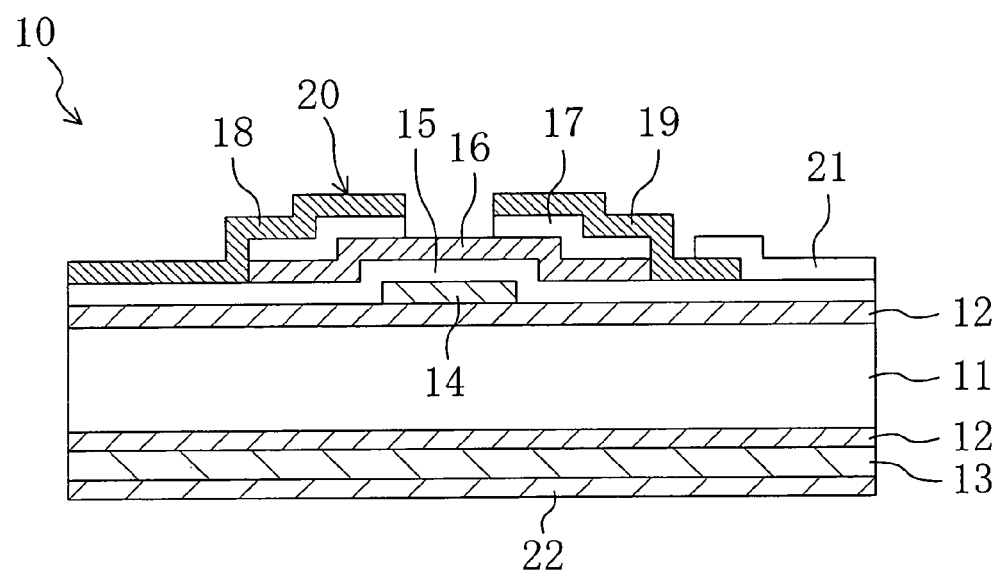
FIG. 6 is an enlarged sectional view illustrating an active matrix substrate according to Embodiment 3.

FIG. 6 illustrates an active matrix substrate 10 according to Embodiment 3 of the present invention. The active matrix substrate 10 of the present embodiment is the same as that of Embodiment 1 except that a protective film 22 is added.

More specifically, the conductive film 13 is made of a conductive polymer material and the surface thereof is covered with the protective film 22. The protective film is made of an insulating film 22. The insulating film 22 may be an inorganic insulating film made of silicon nitride or silicon oxide.

The protective film 22 may be formed to cover at least part of the conductive film 13. However, for reliable protection, it is preferred that the protective film 22 covers the entire surface of the conductive film 13.

The conductive film 13 shown in FIG. 6 is not electrically grounded. However, also in this embodiment, the presence of the conductive film 13 on the substrate 11 allows dispersion of static charge over the entire surface of the conductive film 13. Therefore, dielectric breakdown in the TFTs 20 is prevented from occurring.

The substrate 11 provided with the conductive film 13 made of a conductive polymer will be introduced in a vacuum chamber, heated to high temperatures and immersed in a chemical agent such as an etchant in the manufacturing process of the TFTs 20. Therefore, the conductive film 13 may possibly deteriorate or come off. However, in the present embodiment, the protective film 22 covering the conductive film 13 gives the conductive film 13 resistance to the deterioration and coming off.

OTHER EMBODIMENTS

The apparatus 2 for manufacturing the active matrix substrate 10 of the present invention is applicable to not only the film forming apparatuses used in a vacuum as described above, but also etching apparatuses and coating apparatuses.

The active matrix substrate 10 according to the present invention is applicable to not only the liquid crystal displays as described above, but also other display devices having other display medium layers such as organic EL displays and plasma display panels.

In the above-described embodiments, the substrate stage 50 of the manufacturing apparatus 2 is formed by the insulating main body 52. However, the present invention is not limited thereto. The support surface 51 of the substrate stage 50 may be made of a conductive material and the support surface 51 may be electrically grounded. By so doing, the conductive film 13 is grounded with a simple structure.

As described above, the present invention is useful for an active matrix substrate including a substrate made of a plastic material, an apparatus for manufacturing the same and a display device using the same. The present invention prevents dielectric breakdown caused in active elements by static charge, avoids defects derived from a long-term static buildup and suppresses expansion, contraction and warpage of a plastic substrate. In particular, the present invention is advantageous in that a substrate is quickly transferred on the roll-to-roll system in the course of manufacture while dielectric breakdown in active elements is prevented, thereby achieving a significant reduction in manufacturing cost.

What is claimed is:

1. An apparatus for manufacturing an active matrix substrate comprising:
    a substrate made of a plastic material;
    a plurality of active elements which are arranged in matrix configuration on one side of the substrate and connected to signal wires;
    a conductive film which is arranged on the other side of the substrate on which the active elements are not provided, and which is electrically grounded;
    an inorganic film which is provided on one or both sides of the substrate; and
    a winding shaft arranged to wind the substrate thereon in the form of a roll, wherein
    the apparatus includes a substrate stage arranged to support the substrate on a support surface;
    the support surface is made of a conductive material, and is electrically grounded; and
    the winding shaft is electrically grounded.

2. An apparatus for manufacturing an active matrix substrate comprising:
    a substrate made of a plastic material;
    a plurality of active elements which are arranged in matrix configuration on one side of the substrate and connected to signal wires;
    a conductive film which is arranged on the other side of the substrate on which the active elements are not provided, and which is electrically grounded; and
    an inorganic film which is provided on one or both sides of the substrate; wherein
    the apparatus includes a substrate stage arranged to support the substrate on a support surface, and a grounding mechanism which is arranged on the substrate stage, the grounding mechanism being arranged to electrically ground the conductive film of the substrate while the substrate is placed on the support surface of the substrate stage;

the support surface is made of an insulator;

the grounding mechanism includes a ground wire whose lower end is connected to a ground plane, and the grounding mechanism is arranged to penetrate the substrate stage in the vertical direction; and an upper end of the ground wire is biased upward to protrude from the support surface when the substrate is not mounted on the substrate stage, and is arranged to be pressed downward when the substrate is mounted on the substrate stage to bring the substrate into contact with both the support surface and the ground wire.

* * * * *